(12) United States Patent
Ott et al.

(10) Patent No.: US 8,637,836 B1
(45) Date of Patent: Jan. 28, 2014

(54) HIGH ASPECT RATIO SAMPLE HOLDER

(71) Applicant: International Business Machines Corporation, Armonk, NY (US)

(72) Inventors: John A. Ott, Greenwood Lake, NY (US); Mark C. Reuter, Montrose, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/658,733

(22) Filed: Oct. 23, 2012

Related U.S. Application Data

(63) Continuation of application No. 13/629,193, filed on Sep. 27, 2012.

(51) Int. Cl.
*H01J 37/20* (2006.01)
(52) U.S. Cl.
USPC ...... 250/440.11; 250/306; 250/310; 250/311; 250/441.11; 250/442.11
(58) Field of Classification Search
USPC ............ 250/306, 307, 310, 311, 440.11, 250/441.11, 442.11
See application file for complete search history.

(56) References Cited

U.S. PATENT DOCUMENTS

| | | | | |
|---|---|---|---|---|
| 2,512,947 A * | 6/1950 | Verhoeff et al. | ......... | 250/441.11 |
| 3,679,900 A * | 7/1972 | Kimura | ........ | 250/441.11 |
| 4,188,118 A | 2/1980 | Weinstein | | |
| 4,223,224 A * | 9/1980 | Rauch | .......... | 250/442.11 |
| 4,703,181 A * | 10/1987 | Swann et al. | .......... | 250/442.11 |
| 4,797,261 A * | 1/1989 | Swann et al. | .......... | 422/65 |
| 5,039,864 A * | 8/1991 | Kondo | ........ | 250/442.11 |
| 5,225,683 A * | 7/1993 | Suzuki et al. | ........ | 250/442.11 |
| 5,406,087 A * | 4/1995 | Fujiyoshi et al. | ........ | 250/440.11 |
| 5,412,503 A * | 5/1995 | Nederlof | ........ | 359/393 |
| 5,581,088 A * | 12/1996 | Kasai | ........ | 250/440.11 |
| 5,698,856 A * | 12/1997 | Frasca | ........ | 250/440.11 |
| 5,753,924 A * | 5/1998 | Swann | ........ | 250/443.1 |
| 6,188,072 B1 | 2/2001 | Chung | | |
| 6,669,121 B2 * | 12/2003 | Kasai | ........ | 250/442.11 |
| 6,927,391 B2 * | 8/2005 | Tokuda et al. | ........ | 850/10 |
| 7,091,498 B2 * | 8/2006 | Moriya | ........ | 250/442.11 |
| 7,586,105 B2 * | 9/2009 | Molhave | ........ | 250/440.11 |
| 7,935,937 B2 * | 5/2011 | Moore et al. | ........ | 250/442.11 |
| 8,101,924 B2 | 1/2012 | Hamochi | | |
| 8,102,523 B1 | 1/2012 | Marsh | | |
| 8,148,700 B2 | 4/2012 | Miyazaki | | |
| 8,288,737 B1 * | 10/2012 | Walck | ........ | 250/440.11 |
| 8,440,982 B1 * | 5/2013 | Kim et al. | ........ | 250/442.11 |
| 2006/0175014 A1 * | 8/2006 | Cox | ........ | 156/345.43 |
| 2008/0315097 A1 * | 12/2008 | Tanaka et al. | ........ | 250/311 |
| 2010/0006771 A1 * | 1/2010 | Miyazaki | ........ | 250/442.11 |
| 2010/0102248 A1 * | 4/2010 | Milas et al. | ........ | 250/440.11 |
| 2010/0140497 A1 | 6/2010 | Damiano | | |
| 2010/0320396 A1 * | 12/2010 | Terada et al. | ........ | 250/441.11 |
| 2011/0174974 A1 * | 7/2011 | Tokuda et al. | ........ | 250/310 |

* cited by examiner

*Primary Examiner* — Michael Logie
(74) *Attorney, Agent, or Firm* — George Sai-Halasz; Louis J. Percello

(57) ABSTRACT

An elongated member is formed which has a frontal and a distal end, and a length axis. The frontal end satisfies vacuum sealing and maneuverability specifications of a sample holder for a particle beam microscope. The elongated member includes a tubular section defining an axial cavity along the length axis, and having an orifice toward the distal end of the elongated member. The resulting device is characterized as being a sample holder for use in particle beam microscopes. The sample holder enables the examination of high aspect ratio samples by accommodating them in its axial cavity. The examination can take place without prior modification of the high aspect ratio samples.

8 Claims, 4 Drawing Sheets

"HAR" SAMPLE

HIGH ASPECT RATIO SAMPLE HOLDER

CROSS REFERENCE TO A RELATED APPLICATION

This application is a Continuation of application Ser. No. 13/629,193, filed Sep. 27, 2012, which is incorporated herein by reference in its entirety.

BACKGROUND

The present invention relates to the nano and pico scale examination of samples that have macroscopic dimensions. In particular it relates to special sample holders that are capable to secure high aspect ratio samples for being examined in particle beam microscopes.

BRIEF SUMMARY

An elongated member is formed which has a frontal and a distal end, and a length axis. The frontal end satisfies vacuum sealing and maneuverability specifications of a sample holder for a particle beam microscope. The elongated member includes a tubular section defining an axial cavity along the length axis, and having an orifice toward the distal end of the elongated member. The resulting device is characterized as being a sample holder for use in particle beam microscopes. The sample holder enables the examination of high aspect ratio samples by accommodating them in its axial cavity. The examination can take place without prior modification of the high aspect ratio samples.

BRIEF DESCRIPTION OF THE SEVERAL VIEWS OF THE DRAWINGS

These and other features of the present invention will become apparent from the accompanying detailed description and drawings, wherein.

DETAILED DESCRIPTION

Examining nano-materials and nanostructures, and developing applications for their use is pressing the boundaries of materials science. New diagnostic tools and sensors are needed for continuing progress. Particle beam microscopy, such as transmission electron microscopy, may enable the understanding of new phases, shapes, and structures on the nano scale.

For rapid turnaround of diagnostics procedures, for the preservation of desirable samples, for determining if a step in a microfabricating sequence was successful, and for many other reasons, it may be desirable to be able to examine samples in a particle beam microscope (PBM) without having to modify them. In a typical PBM such as a transmission electron microscope (TEM) samples have to fit into roughly 3 mm circles. This often requires samples be modified and thinned to fit into a TEM, with possibly undesirable consequences. Thus it would be desirable to be able to study in PBM samples at the nano ($10^{-9}$ m) scale, while in some dimension such samples may be macroscopic such as the cm ($10^{-2}$ m) scale. Such samples may be called high aspect ratio (HAR) samples.

Embodiments of the present invention teach sample holders that allow HAR samples to be examined in a PBM without having to modify the sample.

The following discussions will be mainly in terms of a TEM. However, it is understood that this is by way of example only, and the embodiments of the present invention are applicable to other PBMs, such as scanning electron microscopes (SEM), or focused ion beam (FIB) systems. The examinations of HAR samples in the PBMs may include, but are not limited to, visual, electrical, or chemical examinations, as it is known in the art.

Figure 1:
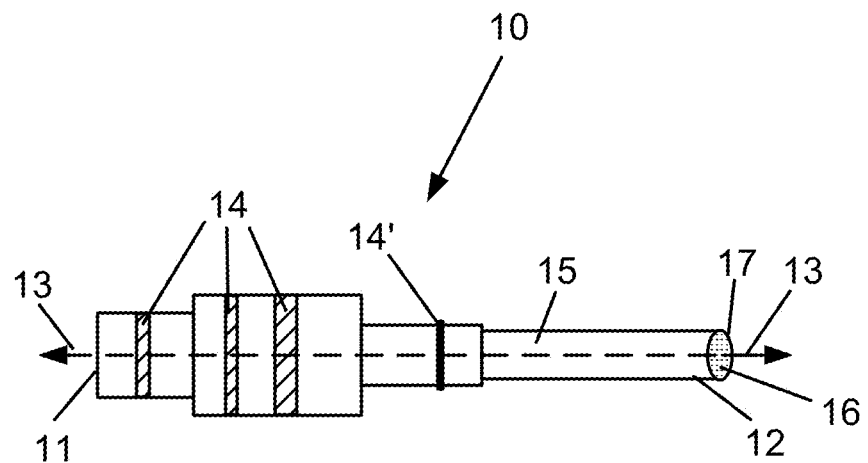
FIG. 1 shows a schematic view of an elongated member sample holder for a particle beam microscope (PBM) according to an embodiment of the disclosure.

FIG. 1 shows a schematic view of an elongated member 10 sample holder for a PBM according to an embodiment of the disclosure. The elongated member 10 has a frontal end 11 and a distal end 12. The elongated member 10 also defines, and consequently has, a length axis 13. The direction of the length axis 13 may be the direction that the elongated member 10 sample holder would be inserted in a PBM, typically into a side entry PBM.

The frontal end 11 of the elongated member 10 is made to satisfy vacuum sealing and maneuverability specifications of a sample holder for a PBM. For representative embodiments of the invention such a PBM would be a side entry PBM. The possible maneuverability 14 features and the vacuum sealing 14' features are only symbolically indicated in FIG. 1. Such features generally are well known in the art. It may happen that in forming the elongated member 10 one modifies an original, possibly manufacturer supplied sample holder. In such a case the frontal end of the original sample holder may be kept essentially intact. By using a portion of an originally supplied device one may be assured that the vacuum sealing and maneuverability specifications, and/or any other aspects of possible importance for properly fitting and using the elongated member 10 sample holder in a BPM are being satisfied.

Toward its distal end 12 the elongated member 10 sample holder has a tubular section 15. This tubular section 15 defines an axial cavity 16 within itself, along the a length axis 13 of the sample holder. The tubular section 15 has an orifice 17 toward the distal end 12. The axial cavity 16 inside the tubular section 16 may serve to accommodate most of a HAR sample, while a tip of the sample may be exposed to the particle beam of the PBM. Often, but not necessarily, such HAR samples may be thought of and discussed as being needle like.

Overall the elongated member 10 device may be characterized as being a sample holder enabling examination of HAR samples in PBMs by accommodating the HAR samples in the axial cavity 16 of the tubular section 15. Consequently, the HAR samples may be examined without having to modify them for the examination, as it would be necessary with sample holders available in the prior art.

Such an elongated member 10 sample holder may span a relatively wide range of lengths depending mainly on the PBM that it pertains to. The elongated member may be only 2 to 3 cm long, but may be up to 50 cm long. Typically it may be between 30 cm and 40 cm long. A needle like, HAR sample may be up to 15 cm long.

Figure 2:
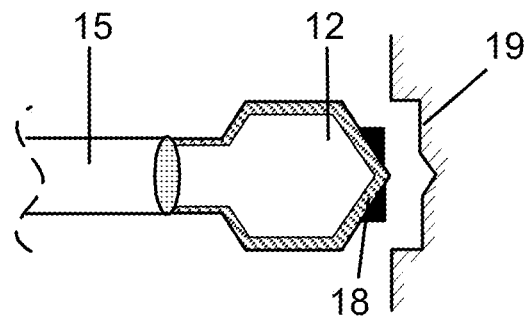
FIG. 2 shows a schematic view of an elongated member toward its distal end, connecting to fixtures of a PBM according to an embodiment of the disclosure.

FIG. 2 shows a schematic view of an elongated member toward its distal end, connecting to fixtures of a PBM according to an embodiment of the disclosure. The wavy line on the figure indicates that the elongated member is only partially shown toward its distal end 12. The tubular section 15 may be followed by a support structure 18, which is capable to connect with fixtures 19 of the PBM, typically, but not necessarily, a side entry PBM, for damping vibrations in the elongated member during examinations. The support structure 18 may be "U" shaped to allow room for a sample tip, and not to impede the particle beam which in this case would be perpendicular to the plane of FIG. 2. The features 19 an the support structure 18 are only symbolically represented, many such features and connections are known in the art. Typical sample holders of the prior art also have vibration dumping qualities engineered in.

FIGS. 3A-3D show various schematic views of bracing members coupled to the elongated member according to various embodiments of the disclosure. A bracing member may serve the purpose of securing a sample into position such that the tip, or possibly another part of the sample, is exposed to the particle beam of the PBM when the elongated member is inserted into the PBM, typically, but not necessarily, a side entry PBM. In representative embodiments of the invention the bracing member would secure a HAR sample substantially in parallel with the length axis 13. Meanwhile, the bracing member may be coupled to the elongated member in various ways. FIGS. 3A-3D show various such ways with the understanding that this is by example only without intent of limiting, and other ways of securing the sample to the elongated member 15 holder are also within the scope of the instant disclosure.

Figure 3A:
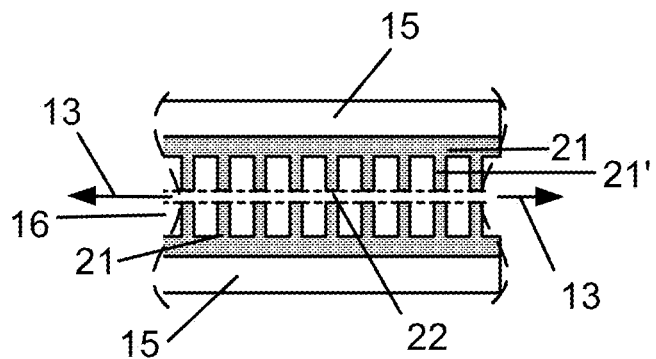
FIGS. 3A-3D show various schematic views of bracing members coupled to the elongated member according to various embodiments of the disclosure.
Figure 3B:
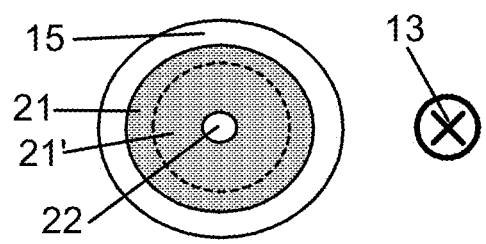

FIG. 3A shows a cross sectional view of part of the tubular section 15, and FIG. 3B shows a view looking into the tubular section 15, displaying a bracing member in a representative embodiment of the invention. FIGS. 3A-3B show a bracing member that has a resiliently deformable structure 21 with a slot 22, which slot is directed along the length axis 13. For the view of FIG. 3B, where as indicated the length axis 13 is pointing out of the plane of the figure, the intension is to convey that the bracing member is tightly fitted into the axial cavity 16 of the tubular section 15. In this figure and in other figures with the same view direction, the length axis 13 is shown only for indicating direction, hence to avoid cluttering the figures it is positioned to the side. The slot 22 is so sized that the resiliently deformable structure 21 is capable to resistantly accept, and thereby secure, the high aspect ratio sample to be examined.

The HAR sample maybe held securely by the finger like 21' parts of the resiliently deformable structure 21. In FIG. 3B only a dashed line indicates the position of the finger like 21' parts, since typically all of the resiliently deformable structure 21 is made of the same material, and thus the finger like 21' parts are not easily distinguishable in the view of FIG. 3B.

Figure 3C:
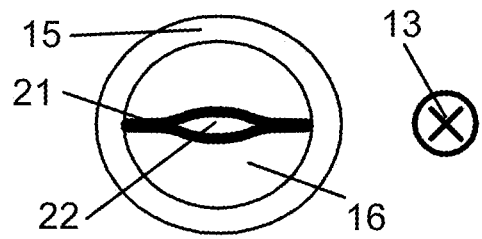

FIG. 3C shows an alternate embodiment for a bracing member that has a resiliently deformable structure 21 with a slot 22, and again, as indicated by the length axis 13, the view is one of looking into the axial cavity 16 of the tubular section 15. In this case the resiliently deformable structure 21 may be of two laminated parts that in the middle can be forced to open up, creating the slot 22 for a HAR sample.

There may be many materials that would be suitable for the resiliently deformable structure 21 for securing the sample. In a typical embodiment the material of the resiliently deformable structure 21 has a vapor pressure of less than about $10^{-6}$ torr. The reason for such a desired property is that typically in a PBM the pressure is lowered to about $10^{-6}$ torr during operation. Accordingly, suitable materials without intent of limiting, for the resiliently deformable structure 21 may include, Teflon, Viton, silicon based polymers. In some embodiments the material for the resiliently deformable structure 21 maybe a metal, such as Al or Au.

Figure 3D:
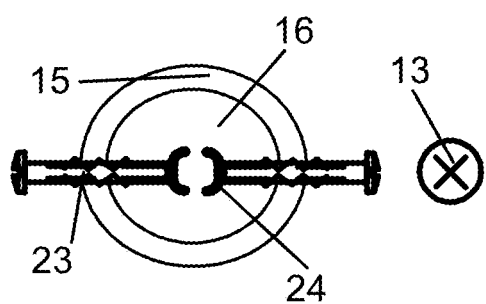

FIG. 3D shows another typical embodiment of the disclosure when the bracing member is in the form of a screw 23 and/or a clamp 24. In this figure, again as indicated by the length axis 13, the view is one of looking into the axial cavity 16 of the tubular section 15. The figure is somewhat symbolic, there are may ways knows of securing samples with screws and/or clamps inside a tubular structure.

Figure 4:
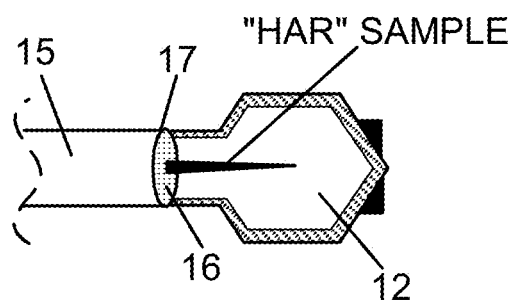
FIG. 4 schematically depict a distal section of an elongated member sample holder with a high aspect ratio sample.

FIG. 4 schematically depict a distal section of an elongated member sample holder with a high aspect ratio sample in place. For whatever form the bracing member takes, the distal end 12 of the elongated member 10 would have the sample exposed to the particle beam of the PBM. The tubular member 15, the axial cavity 16, and the orifice 17, are shown as in previous figures. The HAR sample, which as said before, may sometimes be needle like, emerges from the axial cavity, and with the maneuverability 14 features (not shown in FIG. 4) of the sample holder may be maneuvered into the path of the particle beam. The direction of the particle beam in this case would be perpendicular to the plane of FIG. 4. A support structure for vibration dumping also shown in the figure, but it is not necessarily an essential part of all embodiments.

Figure 5:
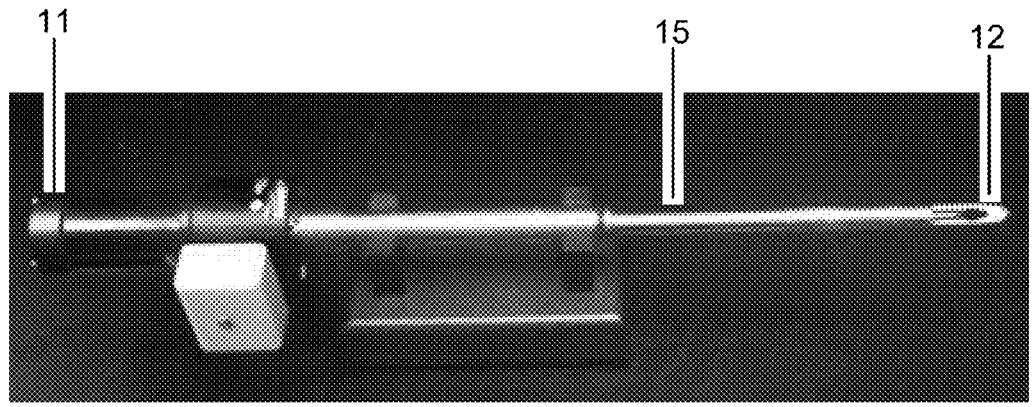
FIG. 5 is a photograph of an elongated member sample holder according to an embodiment of the disclosure.

FIG. 5 is a photograph of an elongated member sample holder according to an embodiment of the disclosure. The shown holder is approximately 35 cm long and it is for use in a TEM. The frontal end 11, the distal end 12, and the tubular section 15 are indicated for correspondence with the previous figures. This photograph is by way of example and it should not be interpreted in a limiting fashion.

Figure 6:
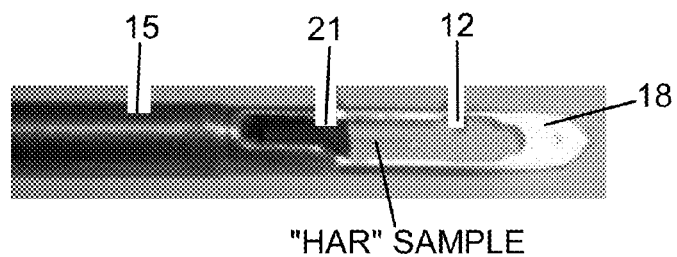
FIG. 6 is a photograph of the distal end of the elongated member sample holder with a high aspect ratio sample.

FIG. 6 is a photograph of the distal end of the elongated member sample holder with a high aspect ratio (HAR) sample. The tubular section 15 is indicated. In this particular holder the resiliently deformable structure 21 of the bracing member is made of Viton or Chem res. and it is formed in the way as depicted in FIG. 3C. The resiliently deformable structure 21 of the bracing member extends somewhat beyond the axial cavity of the tubular section 15, but such arrangements are well within scope of the embodiments of the present invention. A HAR sample, which in this case is a glass pipette, is visible upon careful observation as it extends out of the resiliently deformable structure 21 of the bracing member. This photograph is by way of example and it should not be interpreted in a limiting fashion.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under," "upper", "side," "over", "underneath", "parallel", "perpendicular", "vertical", etc., as used herein refer to relative location and orientation of various portions of the structures with respect to one another, and are not intended to suggest that any particular absolute orientation with respect to external objects is necessary or required.

The foregoing specification also describes processing steps. It is understood that the sequence of such steps may vary in different embodiments from the order that they were detailed in the foregoing specification. Consequently, the ordering of processing steps in the claims, unless specifically stated, for instance, by such adjectives as "before", "ensuing", "after", etc., does not imply or necessitate a fixed order of step sequence.

Any trademark occurring in the text or drawings is the property of its owner and occurs herein merely to explain or illustrate one example of how an embodiment of the invention may be implemented.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

The invention claimed is:

1. A device, comprising:
    an elongated member having a frontal and a distal end and a length axis, wherein said elongated member comprises a tubular section defining an axial cavity therewithin, directed along said length axis and having an orifice toward said distal end, wherein said frontal end is inserted vacuum sealing tight into a particle beam microscope (PBM), and said frontal end is capable to maneuver said tubular section;
    a bracing member for securing substantially in parallel with said length axis a high aspect ratio sample having a tip, wherein said bracing member is coupled to said elongated member in such position that said tip can be exposed to a particle beam of said PBM; and
    wherein said device is characterized as being a sample holder enabling examination of said high aspect ratio sample in said PBM by accommodating said high aspect ratio sample in said axial cavity.

2. The device of claim 1, wherein said distal end is capable to connect with fixtures of said PBM for damping vibrations of said elongated member.

3. The device of claim 1, wherein said bracing member comprises a resiliently deformable structure with a slot, wherein said slot is so sized that said resiliently deformable structure is capable to resistantly accept, and thereby secure, said high aspect ratio sample.

4. The device of claim 3, wherein said bracing member is tightly fitting into said axial cavity with said slot directed along said length axis.

5. The device of claim 3, wherein said resiliently deformable structure is of a material having a vapor pressure less than about $10^{-6}$ torr.

6. The device of claim 1, wherein said bracing member is in the form of a screw and/or a clamp.

7. The device of claim 1, wherein said a tubular section is made of metal.

8. The device of claim 1, wherein said PBM is a Transmission Electron Microscope (TEM).

* * * * *